(12) United States Patent
Shi et al.

(10) Patent No.: US 6,571,865 B1
(45) Date of Patent: Jun. 3, 2003

(54) HEAT TRANSFER SURFACE

(75) Inventors: Xu Shi, Singapore (SG); Hong Siang Tan, Singapore (SG)

(73) Assignee: Nanyang Technological University (SG)

( * ) Notice: Subject to any disclaimer, the term of this patent is extended or adjusted under 35 U.S.C. 154(b) by 0 days.

(21) Appl. No.: 09/335,498

(22) Filed: Jun. 18, 1999

(30) Foreign Application Priority Data

May 10, 1999 (GB) .............................................. 9910841

(51) Int. Cl.[7] .............................................. F28F 19/02
(52) U.S. Cl. ........................ 165/133; 428/408; 427/580
(58) Field of Search ................................ 165/185, 80.3, 165/133; 427/580, 575; 428/336, 408

(56) References Cited

U.S. PATENT DOCUMENTS

| | | | |
|---|---|---|---|
| 4,601,933 A | | 7/1986 | Nakamura et al. |
| 4,782,893 A | * | 11/1988 | Thomas ....................... 165/185 |
| 5,146,314 A | | 9/1992 | Pankove |
| 5,273,825 A | | 12/1993 | Herb et al. |
| 5,411,797 A | * | 5/1995 | Davanloo et al. ........... 428/336 |

(List continued on next page.)

FOREIGN PATENT DOCUMENTS

| | | |
|---|---|---|
| DE | 40 16 935 A1 | 11/1991 |
| DE | 196 44692 A1 | 4/1998 |
| EP | 0 142 176 | 3/1984 |
| EP | 0 632 344 A2 | 1/1995 |
| EP | 0 660 400 A1 | 6/1995 |
| GB | 2 174 280 A | 10/1986 |
| GB | 2 174 878 A | 11/1986 |
| GB | 2 205 859 A | 12/1988 |
| GB | 2 311 539 A | 10/1997 |
| WO | WO 97/49840 | 12/1997 |
| WO | WO 98/18977 | 5/1998 |
| WO | WO 99/22398 | 5/1999 |

OTHER PUBLICATIONS

Kurihara Kazuaki, JP Abstract No. 4028255 A, "Semiconductor Cooling Device", Jan. 1992.
Matsushita Denki Sangyo KK, JP Abstract No. 62–117513, "Vessel for treating food—has diamond(-like) pellicle coating on heat–transfer part which contacts food", 1994.

(List continued on next page.)

*Primary Examiner*—Henry Bennett
*Assistant Examiner*—Temell McKinnon
(74) *Attorney, Agent, or Firm*—Sterne, Kessler, Goldstein & Fox P.L.L.C.

(57) ABSTRACT

The present invention relates to a heat transfer surface comprising a layer of carbon, to a heating element or condenser comprising said heat transfer surface, to a method of applying said heat transfer surface, and to a method for carrying out dropwise condensation employing said heat transfer surface.

The carbon layer employed in the present invention is tetrahedral amorphous carbon and/or diamond-like carbon.

In addition, the carbon layer may be a composite (eg. an alloy) of the above carbon sources with another component such as nickel, chromium or Teflon®.

The heat transfer surface of the present invention permits dropwise condensation rather than film wise condensation to proceed. The surface also exhibits improved resistance to fouling such as scale build-up caused by hard water.

The heat transfer surface of the present invention has particular application in kettles, washing machines, dishwashers and condensers.

13 Claims, 2 Drawing Sheets

Heat transfer coefficients vs. time ($CaSO_4$: 1.6 g/l; Heat Flux: 100 kW/$m^2$)

U.S. PATENT DOCUMENTS

| | | | | | |
|---|---|---|---|---|---|
| 5,474,816 | A | * | 12/1995 | Falabella | 427/580 |
| 5,542,471 | A | * | 8/1996 | Dickinson | 165/185 |
| 5,566,752 | A | * | 10/1996 | Arnold et al. | 165/185 |
| 5,645,900 | A | | 7/1997 | Ong et al. | |
| 5,846,613 | A | * | 12/1998 | Neuville | 427/575 |
| 6,063,246 | A | * | 5/2000 | Wolfe et al. | 427/526 |

OTHER PUBLICATIONS

Blackman, L. C. F., et al., "An Investigation of Compounds Promoting the Dropwise Condensation of Steam," *J. Appl. Chem.* 7:160–171 (1957).

Marto, P. J., et al., "Evaluation of organic coatings for the promotion of dropwise condensation of steam," *Int. J. Heat Mass Transfer* 29:1109–1117 (1986).

Paren, J., and Pouzenc, C., "Design of Power Station Condensers," *GEC Alsthom Tech. Rev.* 6:19–38 (1991).

Tanasawa, I., "Dropwise Condensation: The Way To Practical Applications," *Proc. $6^{th}$ Int. Heat Transfer Conf.* 6:393–405 (1978).

Tanasawa, I., "Advances in Condensation Heat Transfer," *Advances in Heat Transfer* 21:55–139 (1991).

Patent Abstracts of Japan, Publication No. 11–100294, "Hard Carbon Thin Film and Its Production", Apr. 1999.

* cited by examiner

Figure 1:
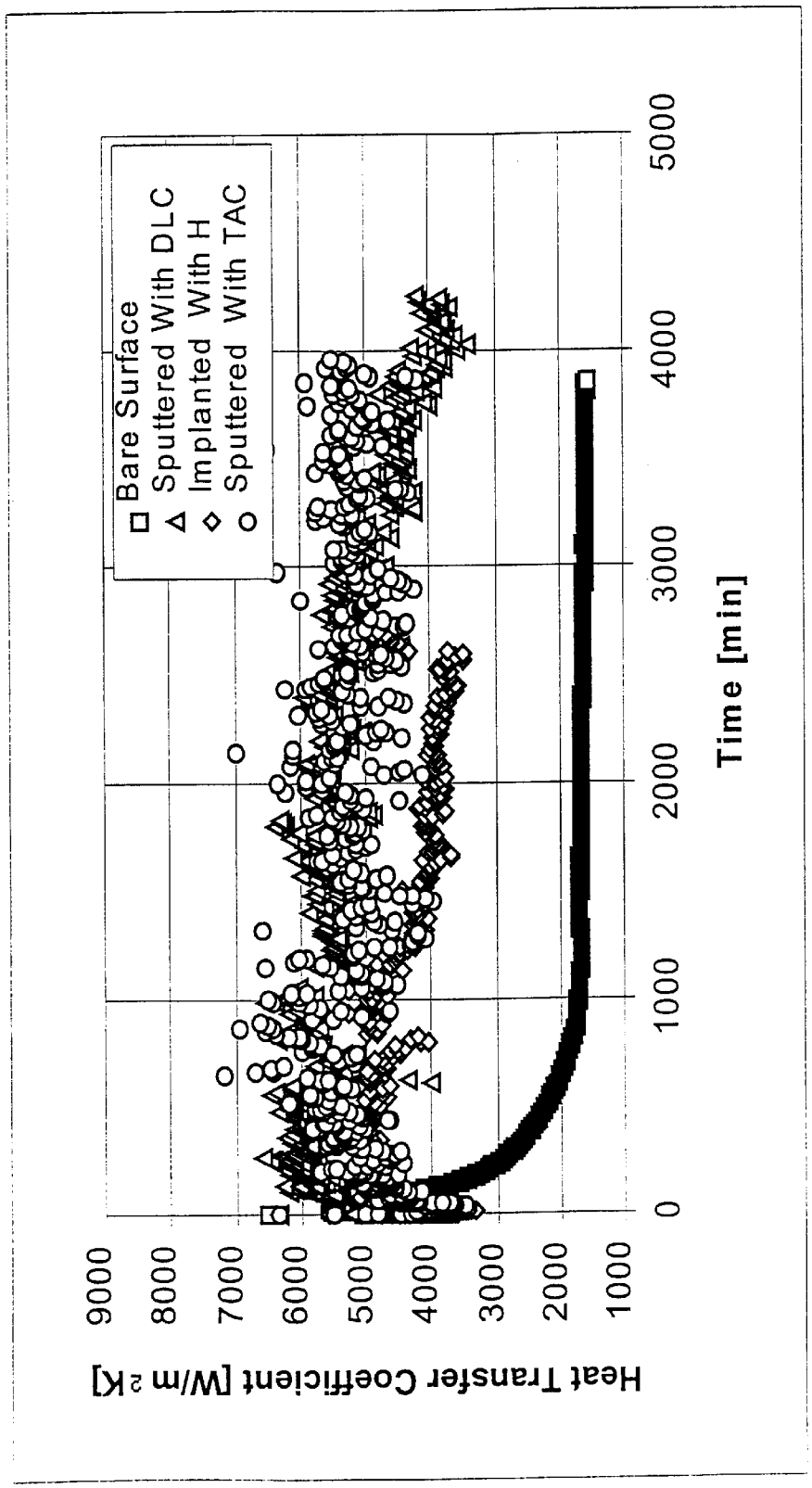

Figure 1  Heat transfer coefficients vs. time (CaSO$_4$: 1.6 g/l; Heat Flux: 100 kW/m$^2$)

HEAT TRANSFER SURFACE

The present invention relates to a heat transfer surface, to a heating element or condenser comprising said heat transfer surface, to a method of applying said heat transfer surface and to a method for carrying out dropwise condensation employing said heat transfer surface.

During heating of a fluid via a heat transfer surface the surface will readily become coated with various deposits (eg. $CaCO_3$, $CaSO_4$ and $MgSO_4$) which are dissolved or partially dissolved in the fluid. Users of kettles in hard water areas will be well acquainted with this problem. Such deposits have an adverse effect on the heat transfer coefficient of the surface, which is reduced. This, in turn, leads to a decreased working efficiency of the heat transfer surface and/or a reduction in its service life.

There is therefore a need for a heat transfer surface which alleviates the prior art problem of undesirable build-up of deposits.

Condensation processes employ the use of a condenser, also having a heat transfer surface. Due to the nature of conventional metal materials used in the construction of heat exchangers, filmwise condensation occurs in industrial plants, for example in electric utility condensers and commercial distillation plant condensers [1]. Filmwise condensation results in a film of liquid forming over the heat transfer surface, the liquid typically being water which is a very poor conductor of heat. This film then acts as an insulator and impedes efficient heat transfer across the heat transfer surface.

Dropwise condensation has received much attention in the past because of the inherent order of magnitude higher (eg. up to 20 times higher) steam-to-condensing wall heat transfer coefficients that can be achieved compared with filmwise condensation.

To date, however, suitable dropwise condensation surfaces have not been developed to the satisfaction of condenser designers [2]. In this respect, it is a prerequisite for achieving dropwise condensation that the condensing surface possess a low surface energy [2]. Known metal surfaces possess a high surface energy with the result that steam condenses filmwise on such surfaces. To obtain dropwise condensation on a metal surface, the surface energy must be reduced and the following methods have been tried [3]:

(i) to apply organic promoters to a condenser surface;
(ii) to coat the surface with organic polymer; and
(iii) to electroplate a layer of silver or gold on the surface.

Referring to (i), a solution of organic promoter (ie. non-wetting agent) may be wiped, brushed or sprayed onto the surface. However, such promoters wash off within a few hours of use, and dropwise condensation on the surface changes to filmwise condensation [4].

Referring to (ii), many attempts have been made to produce long-term dropwise surfaces by coating with organic polymers [5]. However, because the polymers such as PTFE (Teflon®) have a very low film conductivity, most of the benefits of dropwise condensation are offset by an increase in the thermal resistance of the polymer coating itself.

Referring to (iii), thin coatings of silver and gold have been shown to promote dropwise condensation. However, such coatings are impracticable from an economic point of view.

There is therefore a need for a heat transfer surface which may be used to achieve dropwise condensation.

The above prior art problems are alleviated by the present invention which, according to a first aspect, provides a heat transfer surface comprising a layer of tetrahedral amorphous carbon and/or diamond-like carbon, and/or a composite thereof.

Tetrahedral amorphous carbon (ta-C) is a substantially hydrogen-free form of diamond-like carbon with an sp3 bonding fraction that can be up to 90% or higher. The hydrogen content of ta-C is preferably less than 20% (w/w), and the sp3 bonding fraction is typically at least 50%, preferably at least 60%, more preferably at least 70%. The properties of ta-C are similar to those of crystalline carbon, with a short range tetrahedral order and a density approaching that of diamond. It has a similar hardness, chemical inertness and thermal stability to that of diamond. Large compressive stresses (up to 10 GPa) can be associated with the growth of high sp3 fraction films, and these stresses can reduce the adhesion of such films at higher film thicknesses. Improved adhesion is conveniently obtained by depositing an intermediate reactive metal or metal oxide layer to bond the film and the substrate together, allowing the deposition of ta-C onto any smooth surface material. Adhesion may also be promoted by depositing ta-C films using FCVA techniques on to a substrate which has been negatively biased (typically between −500 to −5000 V). Such biasing creates an interface surface which interacts well with the top surface layers of the substrate, thereby providing much improved adhesion. In addition, ta-C has important electrical properties. The band gap of ta-C is around 2 eV (versus 5 eV for crystalline diamond) making it a suitable candidate for use as a semi-conducting material for a large area and for high temperature device applications.

Diamond-like carbon (DLC), unlike for example a-Si:H, has a nearly state-free optical gap without hydrogenation. It has a hydrogen content of typically 15–60% (w/w), and an sp3 bonding fraction which is typically less than 50%.

In preferred embodiments of the invention, the coating comprises or consists of ta-C. It is particularly preferred when temperatures in excess of 100° C. are likely to be encountered. Hydrogen atoms are very mobile and escape at elevated temperatures leading to a disruption in the structure of the carbon layer. With ta-C, the film is typically substantially hydrogen-free and any such structural disruption is minimised.

The term "composite" means a combination (eg. an alloy) of ta-C or DLC with one or more additional components, typically metal components. The effect of the additional component is generally to modify a physical property of the selected carbon source, such as to increase the hardness and/or hydrophobicity of the coating.

Examples of additional components include gold, silver, nickel, chromium, halides (preferably chloride or fluoride), Teflon® and Teflon®-like organic compounds. Where the additional component is a metal, that metal should preferably have a low surface energy. Where the additional component is Teflon® or Teflon®-like, films of greater thickness can be employed due to the lower stress in such composites. Such films generally have excellent toughness and adhesion properties, and improved thermal stability properties, compared with metal-containing composites.

Composites are preferably employed when high temperatures (eg. 400° C. and above) are encountered.

According to a preferred embodiment the carbon-containing and/or composite layer has a maximum thickness of 1 μm, more preferably a maximum thickness of 0.5 μm. The thicker the layer is, the longer the service life will be. However, if the layer is excessively thick, the heat transfer coefficient may be compromised. For this reason, the carbon and/or composite layer is most preferably 0.06 to 0.1 μm thick.

The carbon and/or composite layer should be preferably clean and uniform in thickness. In this respect, a defect in the layer, especially at the surface, can provide a high stress zone and/or a site for nucleation of scale. The macroparticle content of the coating is preferably zero or close thereto, whilst in practice it is difficult to avoid microparticle (less than 1 μm) deposits.

According to a preferred embodiment of the present invention, a heating element is provided having a heat transfer surface, said heat transfer surface comprising a layer of tetrahedral amorphous carbon and/or diamond-like carbon, and/or a composite thereof. Such a heating element has a prolonged service life and requires less frequent cleaning to remove deposits which may otherwise cause a reduction in the heat coefficient of the element and an increase in the consumption of electricity.

In a specific embodiment of the invention described in more detail below, a heat transfer surface of the present invention is found to be less susceptible to fouling (eg. by $CaSO_4$) than known surfaces. $CaSO_4$ is employed as the industry standard for assessing fouling resistance. In this respect, $CaSO_4$ (the major component of scale build-up in the Example) is more readily deposited and is much more difficult to break down than is $CaCO_3$.

The heat transfer surface of the present invention may be employed in any apparatus in which heat transfer occurs and has particular application in inter alia water heaters such as kettles, dishwashers, washing machines and instant water heaters, and as an evaporator surface, for example in refrigerators and freezers.

Scale build-up at a heat transfer surface is often reduced when the fluid to be heated becomes "excited". For example, when a liquid is boiled, excited liquid molecules may strike the heat transfer surface and dislodge some of the scale. Conversely, when low fluid excitation levels occurs are experienced, little physical removal of scale occurs. This is particularly so, for example, during pasteurisation of milk when it is highly undesirable for the milk to boil. During milk pasteurisation additional build-up is caused by milk proteins (eg. casein). This may be problematic with conventional heat transfer surfaces. In use of embodiments of the heat transfer surface of the present invention such deposits have been advantageously reduced by approximately 50%.

According to another preferred embodiment, there is provided a condenser for use in dropwise condensation, said condenser having a heat transfer surface comprising a layer of tetrahedral amorphous carbon and/or diamond-like carbon, and/or a composite thereof. Use of the heat transfer surface in such a condenser permits a reduced condenser pressure to be employed during condensation which, in turn, results in an improved plant efficiency. Alternatively, use of the claimed heat transfer surface permits a reduced size condenser to be employed.

It is estimated that a 10 mbar decrease in condenser pressure results in 0.9% turbine work increase in a 600 MW coal fired plant, 1.2% in a 900 MW nuclear plant and 0.4% in a combined cycle plant. In the case of a 600 MW plant, the corresponding reduction in coal consumption would be 1,000 tonnes per year, with corresponding reductions in pollution. The introduction of dropwise condensation in power production processes constitutes energy savings.

A heat transfer surface of the present invention may also be used in a new type of shell-and-tube dropwise condenser, for which overall heat transfer coefficients are doubled compared with current filmwise condensers. Hence, the heat transfer area may be reduced by half and considerable materials and energy may be saved. For example, the cost of producing electricity in a power plant may be reduced by a reduction in the number of tubes required or by a reduction of the pressure in the turbine condenser. In typical UK conditions, a 5 mbar pressure reduction is possible, which corresponds to an increase in turbine work of 0.5% in a 600 MW coal fired plant. In turn, this would result in a saving of 9,000 tonnes per year of coal and consequently 30,000 tonnes per year of $CO_2$ emissions [1].

In the case of a condenser, surfaces on both sides of, say, a condenser plate, may comprise a heat transfer surface coated according to the present invention. Such a condenser would benefit from both dropwise condensation on one side and from reduced fouling on the other where, for example, the coolant is water, particularly sea water.

According to a second aspect of the present invention, there is provided a method for preparing a heat transfer surface, comprising applying a layer of tetrahedral amorphous carbon and/or diamond-like carbon, and/or a composite thereof, to the surface.

The surface to be coated with the layer of the present invention is preferably smooth. This may be achieved, for example, by cleaning and/or polishing. Should the surface be greasy, an organic detergent may be employed. Following initial cleaning, the surface may then be subjected to ultrasonic cleaning in a water bath, optionally containing further detergent. The cleaned surface may be then washed with deionised water.

Stainless steel metal is the industry standard heat transfer surface and provides an ideal surface to be coated with a layer according to the present invention. Alternative surfaces include copper and aluminium, though the invention is of application generally to all such surfaces.

Various techniques may be used to deposit a carbon and/or a composite film in accordance with the present invention, see for example the *Handbook of Deposition Technologies for Films and Coatings* (1994), Science and Technology and Applications, second edition (ed. Rointan F. Bunshah), NOYES PUBLICATIONS, Park Ridge, N.J., USA.

A film may be deposited on any surface capable of conducting electricity. The carbon film may be applied by Plasma Enhanced Chemical Vapour Deposition (PECVD). Examples of this technique are "RF Parallel Plate Plasma Deposition" and "Hot Wire Deposition". A general feature of the most common techniques is that the transport of the active particles towards a substrate is determined by diffusion.

Alternatively, plasma deposition techniques may be employed based on the expansion of a thermal plasma into a vessel at low pressure. In this technique, the transport of particles towards the substrate is determined by direct transport.

In particular, a cathodic arc apparatus may be employed for applying the carbon and/or composite layer as disclosed for example in U.S. Pat. No. 5,279,723. U.S. Pat. No. 5,279,723 employs a cathodic arc ion source apparatus in which there is no line-of-site from the arc spot on the target to the substrate which is to be coated, and the present invention may employ this or similar apparatuses. Alternatively, apparatuses having a line-of-site may be employed. This is because a homogenous, macroparticle-free layer of carbon is not critical for the purpose of the present invention. Other suitable methods are disclosed by the present applicants in WO 96/26531, WO 96/26532, WO 98/03988, PCT/IB98/01764, PCT/IB98/01765, PCT/IB98/01762 and PCT/IB98/01768.

Referring to the above methods employing a plasma source, a $O_2$ or $N_2$-containing plasma is a further option.

Such gases help to increase the surface energy of the surface to be coated. This, in turn, leads to improved adhesion of the film to the surface.

The present invention is now described by reference to the following example in which:

FIG. 1 illustrates the results of Example 1, wherein the DLC and ta-C sputtered surfaces are in accordance with the present invention. The H-implanted surface and bare surface represent conventional heat transfer surfaces.

Figure 2:
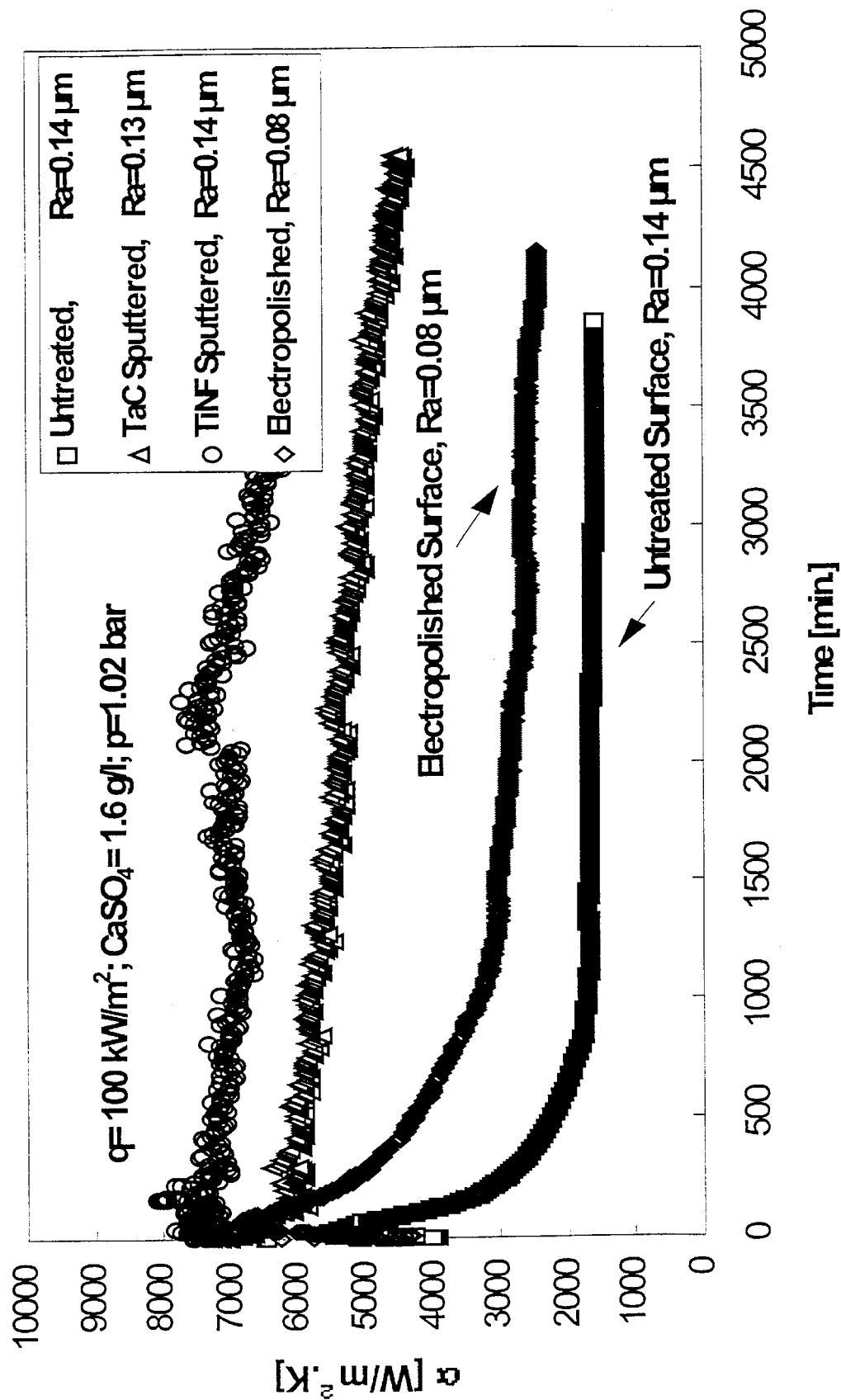

FIG. 2 illustrates the heat transfer properties of various coated surfaces. The TiNF surface is applied by CVD and employs a metal organic compound. The use of an organic compound, as illustrated, frequently results in a deadly toxic coating. In addition, the TiNF coating is less durable than a ta-C based coating and the coating costs are much higher.

EXAMPLE 1

$CaSO_4$ Fouling Test Results During Pool Boiling

Heat rod: sputtered with tetrahedral amorphous carbon (ta-C), by Nanyang Technological University.

Test condition: $CaSO_4$ Solution: 1.6 g/l, Heat Flux: 100 $kW/m^2$.

Results: See FIGS. 1 and 2.

For a bare heater rod (No.432), the average final heat transfer coefficient was about 1900 $W/m^2.K$. After the heater rod (No.432) was coated with ta-C, the average final heat transfer coefficient was increased to about 5000 $W/m^2.K$, as show in the following chart. It was observed that many tiny white flakes were dancing in the solution. This flakes were scale deposits which had broken off the heat transfer surface. During the entire test, only a few parts of the heat transfer surface were covered with a very thin layer of deposit, and most of the heat transfer surface was deposit-free.

Previous fouling test results of a H-implanted heater rod and a DLC sputtered heater rod are also shown in the chart for comparison. By comparing the final heat transfer coefficients, the ta-C coated surface provided the best results, followed by the DLC coated surface.

TABLE 1

Final Heat Transfer Coefficients for Different Treated Surfaces

| Heating Element: Coating | Final Heat Transfer Coefficient [$W/m^2.K$] | Increase [%] |
| --- | --- | --- |
| None | 1900 | — |
| H (implanted) | 3800 | 100 |
| DLC | 4000 | 110 |
| ta-C | 5000 | 163 |

References

[1] Paren, J. and Pouzenc, C., "Design of power station condensers", GEC-Althson Review, No.6, 19, (1991)
[2] Tanasawa, I., "Dropwise condensation—The way to practical applications." Proc. 6th Int. Heat Transfer Conf., vol.6, 393 (1978)
[3] Tanasawa, I., "Advances in Condensation Heat Transfer". Advances in Heat Transfer, vol. 21, 55 (1991)
[4] Blackman, L. C. F., Dewarm, M. J. S. and Hampson, H., "An investigation of compounds promoting the dropwise condensation of steam" J. Appl. Chem. vol.7, 160 (1957)
[5] Marto, P. J., Looney, D. J., Rose, J. W. and Wanniarachchi, A. S., "Evaluation of organic coatings for the promotion of dropwise condensation of steam", Int. J. Heat Mass Transfer, vol.29, No.8, 1109 (1986)

What is claimed is:

1. A water heater comprising an exposed heat transfer surface with water in contact with said exposed heat transfer surface, said heat transfer surface including a layer of tetrahedral amorphous carbon and/or diamond-like carbon, and/or a composite thereof.

2. A water heater as claimed in claim 1, wherein said water heater is a kettle, a dish washer, a washing-machine, or an instant water heater.

3. A condenser for use in dropwise condensation, said condenser comprising an exposed heat transfer surface with a gas in contact with said exposed heat transfer surface, said heat transfer surface including a layer of tetrahedral amorphous carbon and/or diamond-like carbon, and/or a composite thereof.

4. A turbine comprising a condenser as claimed in claim 3.

5. A method for coating a surface of a heating element or a condenser, comprising the steps of:
   applying an electric potential between a carbon-containing target and a surface of a heating element or a condenser;
   generating activated carbon particles;
   applying the activated carbon particles to the surface; and
   thereby forming a layer of tetrahedral amorphous carbon and/or diamond-like carbon, and/or a composite thereof, on the surface of the heating element or condenser.

6. A method for coating a surface of a heating element or a condenser using a cathode arc source, said method comprising the steps of:
   generating an arc between a carbon-containing cathode target and an anode of the source;
   depositing positive carbon target ions on a surface of a heating element or a condenser; and
   thereby forming a layer of tetrahedral amorphous carbon and/or diamond-like carbon, and/or a composite thereof, on the surface of the heating element or condenser.

7. A method for carrying out dropwise condensation, wherein a condenser having a heat transfer surface comprising a layer of tetrahedral amorphous carbon and/or diamond-like carbon, and/or a composite thereof is employed, said method comprising contacting the heat transfer surface with a gas having heat energy, whereupon dropwise condensation of a component of the gas proceeds on the heat transfer surface.

8. A method for carrying out heat transfer, comprising contacting a fluid having heat energy with a heat transfer surface whereupon a component of the heat energy is transferred away from the fluid via the heat transfer surface, wherein the heat transfer surface comprises a layer of tetrahedral amorphous carbon and/or diamond-like carbon, and/or a composite thereof.

9. A method according to claim 8, wherein said heat transfer surface comprises a layer of tetrahedral amorphous carbon.

10. A method according to claim 9, wherein the carbon has an sp3 bonding fraction of at least 70%.

11. A method according to claim 10, wherein the carbon has an sp3 bonding fraction of at least 80%.

12. A method according to claim 8, wherein the carbon is in the form of a composite.

13. A method according to claim 8, wherein the layer has a maximum thickness of 1 $\mu$m.

* * * * *